United States Patent
Kawaguchi et al.

(10) Patent No.: US 9,868,889 B2
(45) Date of Patent: Jan. 16, 2018

(54) THERMAL CONDUCTIVE ELECTROMAGNETIC WAVE ABSORBING SHEET

(71) Applicant: Kitagawa Industries Co., Ltd., Inazawa-shi, Aichi (JP)

(72) Inventors: Yasuhiro Kawaguchi, Kasugai (JP); Takashi Mizuno, Konan (JP)

(73) Assignee: Kitagawa Industries Co., Ltd., Inazawa-shi, Aichi (JP)

( * ) Notice: Subject to any disclaimer, the term of this patent is extended or adjusted under 35 U.S.C. 154(b) by 38 days.

(21) Appl. No.: 14/928,030

(22) Filed: Oct. 30, 2015

(65) Prior Publication Data

US 2016/0122610 A1 May 5, 2016

(30) Foreign Application Priority Data

Oct. 31, 2014 (JP) .................................. 2014-222983

(51) Int. Cl.
| | |
|---|---|
| *B32B 29/02* | (2006.01) |
| *C09K 5/08* | (2006.01) |
| *C08J 5/18* | (2006.01) |
| *C08K 3/22* | (2006.01) |
| *C08K 9/04* | (2006.01) |
| *C08K 9/02* | (2006.01) |
| *H05K 9/00* | (2006.01) |

(52) U.S. Cl.
CPC ........... *C09K 5/08* (2013.01); *C08J 5/18* (2013.01); *C08K 3/22* (2013.01); *C08K 9/02* (2013.01); *C08K 9/04* (2013.01); *H05K 9/0083* (2013.01); *C08J 2333/06* (2013.01); *C08K 2003/2275* (2013.01)

(58) Field of Classification Search
None
See application file for complete search history.

(56) References Cited

U.S. PATENT DOCUMENTS 6,284,363 B1 * 9/2001 Maeda .................. H01Q 17/00
428/328

FOREIGN PATENT DOCUMENTS

| JP | 5083682 | 12/2008 | |
|---|---|---|---|
| JP | 2008297343 | * 12/2008 | ............... C08K 3/22 |

* cited by examiner

*Primary Examiner* — Ling Choi
*Assistant Examiner* — Thuy-Ai N Nguyen
(74) *Attorney, Agent, or Firm* — Jenkins, Wilson, Taylor & Hunt, P.A.

(57) ABSTRACT

A thermal conductive electromagnetic wave absorbing sheet to be provided includes: a polymer including acrylate ester as a monomer; a metal magnetic oxide; and flame retardant filler subjected to surface treatment. The metal magnetic oxide includes a small-diameter metal magnetic oxide with an average particle diameter of 1 to 10 μm and a large-diameter metal magnetic oxide with an average particle diameter of 50 to 100 μm. A mixing ratio between the small-diameter metal magnetic oxide and the large-diameter metal magnetic oxide is in a range of 9:13 to 15:7 in volume ratio. The small-diameter metal magnetic oxide and the large-diameter metal magnetic oxide are contained by 55 to 60 vol % in total in the entire thermal conductive electromagnetic wave absorbing sheet. The flame retardant filler subjected to the surface treatment is contained by 8 to 10 vol % in the entire thermal conductive electromagnetic wave absorbing sheet.

4 Claims, No Drawings

THERMAL CONDUCTIVE ELECTROMAGNETIC WAVE ABSORBING SHEET

CROSS-REFERENCE TO RELATED APPLICATION

This application claims priority from Japanese Patent Application No. 2014-222983 filed with the Japanese Patent Office on Oct. 31, 2014, the entire contents of which are hereby incorporated by reference.

TECHNICAL FIELD

The present disclosure relates to a thermal conductive electromagnetic wave absorbing sheet.

BACKGROUND

A known thermal conductive sheet is formed by molding elastomer such as silicone rubber or acrylic resin containing thermal conductive filler into a sheet. For using the sheet, the sheet is disposed in contact with a heat source of an electronic component or the like in order to promote heat dissipation from the heat source. For example, the sheet is interposed between the heat source of the electronic component and a heat radiator such as a heat sink or a housing panel. In this case, the heat generated by the heat source can be released to the heat radiator. This can suppress the excessive heat generation of the heat source in the electronic component or the like. Moreover, another known thermal conductive sheet has an electromagnetic wave absorbing characteristic. For example, the thermal conductive sheet contains magnetic filler such as ferrite to form a thermal conductive electromagnetic wave absorbing sheet. By covering the electronic component or the like with this sheet, the electromagnetic wave generated from the electronic component or the electronic magnetic wave coming to the electronic component or the like from the outside can be absorbed. In this case, it is also possible to suppress that a heat radiator formed of a metal material operates as an antenna because the thermal conductive sheet contains the magnetic filler.

On the other hand, silicone rubber as one example of the elastomer may produce siloxane gas to adversely affect the electronic appliance. In view of this, various kinds of thermal conductive electromagnetic wave absorbing sheets including the acrylic elastomer that would not produce siloxane gas have been developed (for example, Japanese Patent No. 5083682).

SUMMARY

A thermal conductive electromagnetic wave absorbing sheet according to the embodiment of the present disclosure includes: a polymer including acrylate ester as a monomer; a metal magnetic oxide; and flame retardant filler subjected to surface treatment. The metal magnetic oxide includes a small-diameter metal magnetic oxide with an average particle diameter of 1 to 10 μm and a large-diameter metal magnetic oxide with an average particle diameter of 50 to 100 μm. A mixing ratio between the small-diameter metal magnetic oxide and the large-diameter metal magnetic oxide is in a range of 9:13 to 15:7 in volume ratio. The small-diameter metal magnetic oxide and the large-diameter metal magnetic oxide are contained by 55 to 60 vol % in total in the entire thermal conductive electromagnetic wave absorbing sheet. The flame retardant filler subjected to the surface treatment is contained by 8 to 10 vol % in the entire thermal conductive electromagnetic wave absorbing sheet.

DETAILED DESCRIPTION

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The thermal conductive electromagnetic wave absorbing sheet according to Japanese Patent No. 5083682 contains a phosphorus-based flame retardant. When this sheet is used under an extremely severe environment with high humidity, the flame retardant will decompose. The decomposition may result in the deterioration of the sheet. If the thermal conductive electromagnetic wave absorbing sheet contains a large amount of phosphorus-based flame retardant, such a sheet has the lower magnetic permeability and the lower electromagnetic wave absorbing characteristic.

An object of the present disclosure is to provide a thermal conductive electromagnetic wave absorbing sheet with excellent thermal conductivity and magnetic permeability and with the flame retardant property corresponding to V-2 according to the UL-94 standard, without the use of the phosphorus-based flame retardant.

For achieving the above described object, a thermal conductive electromagnetic wave absorbing sheet according to the present disclosure includes: a polymer including acrylate ester as a monomer; a metal magnetic oxide; and flame retardant filler subjected to surface treatment. The metal magnetic oxide includes a small-diameter metal magnetic oxide with an average particle diameter of 1 to 10 μm and a large-diameter metal magnetic oxide with an average particle diameter of 50 to 100 μm. A mixing ratio between the small-diameter metal magnetic oxide and the large-diameter metal magnetic oxide is in a range of 9:13 to 15:7 in volume ratio. The small-diameter metal magnetic oxide and the large-diameter metal magnetic oxide are contained by 55 to 60 vol % in total in the entire thermal conductive electromagnetic wave absorbing sheet. The flame retardant filler subjected to the surface treatment is contained by 8 to 10 vol % in the entire thermal conductive electromagnetic wave absorbing sheet.

The present inventors have a metal magnetic oxide, which corresponds to electromagnetic wave absorbing filler and also to thermal conductive filler, contained in a polymer including acrylate ester as a monomer. The present inventors have examined the flame retardant property of the thusly formed thermal conductive electromagnetic wave absorbing sheet. As a result, it has been found out that containing an appropriate amount of metal magnetic oxide with an average particle diameter of 50 to 100 μm (hereinafter referred to as large-diameter metal magnetic oxide) causes the metal magnetic oxide to aggregate in the burning of the sheet and fall off together with the polymer. It has also been found out that, in this case, the sheet has the flame retardant property corresponding to V-2. The metal magnetic oxide with such a large particle diameter is desirably contained together with a metal magnetic oxide with an average particle diameter of 1 to 10 μm (hereinafter referred to as small-diameter metal magnetic oxide). In this case, the hardness of the sheet is decreased. This can ensure the close contact with the electronic component and enables the efficient conduction of heat. Furthermore, the kneading in the fabrication is facilitated. In order to secure the flame retardant property, both kinds of metal magnetic oxides are desirably contained in the sheet together with the flame retardant filler.

The thermal conductive electromagnetic wave absorbing sheet according to the present disclosure includes the small-diameter metal magnetic oxide, the large-diameter metal magnetic oxide, and the flame retardant filler subjected to surface treatment. The mixing ratio between the small-diameter metal magnetic oxide and the large-diameter metal magnetic oxide is in the range of 9:13 to 15:7 in volume ratio. Both kinds of metal magnetic oxides are contained by 55 to 60 vol % in total in the entire sheet. The flame retardant filler subjected to the surface treatment is contained by 8 to 10 vol % in the entire sheet. If the mixing ratio between both kinds of metal magnetic oxides is more than the above range, it is difficult to achieve the flame retardant property corresponding to V-2. In addition, in this case, the sheet has the lower magnetic permeability, so that it may be impossible to achieve the sufficient electromagnetic wave absorbing effect. On the other hand, if the mixing ratio between both kinds of metal magnetic oxides is less than the above range, the hardness may be increased to deteriorate the productivity (kneading may become difficult). If the flame retardant filler is contained by less than the above range, it is difficult to achieve the flame retardant property corresponding to V-2. On the other hand, if the flame retardant filler is contained by more than the above range or if the flame retardant filler is not subjected to the surface treatment, the hardness of the sheet may be increased to deteriorate the productivity (kneading may become difficult). The phosphorus-based flame retardant is not necessary in the thermal conductive electromagnetic wave absorbing sheet according to the present disclosure. Therefore, the thermal conductive electromagnetic wave absorbing sheet can have the sufficient resistance against humidity.

If the thermal conductive electromagnetic wave absorbing sheet according to the present disclosure contains the small-diameter metal magnetic oxide by 24 vol % or more, this thermal conductive electromagnetic wave absorbing sheet can have much higher magnetic permeability.

The metal magnetic oxide may be ferrite. The flame retardant filler included in the thermal conductive electromagnetic wave absorbing sheet according to the present disclosure may contain magnesium hydroxide having an average particle diameter of 0.5 to 2 µm and subjected to a higher fatty acid process and aluminum hydroxide having an average particle diameter of 1 to 10 µm and subjected to a titanating process. With these metal hydroxides contained as the flame retardant, the thermal conductive electromagnetic wave absorbing sheet can have the high magnetic permeability and the high thermal conductivity, the flame retardant property corresponding to V-2, and the low hardness and the excellent productivity.

Mixing in Examples

An embodiment according to the present disclosure will be described based on specific examples. The present inventors made a polymer including acrylate ester as a monomer contain ferrite which is a metal magnetic oxide, and at least one of aluminum hydroxide and magnesium hydroxide which is flame retardant filler. This formed the thermal conductive material. This thermal conductive material was then molded into a sheet, thereby providing a thermal conductive electromagnetic wave absorbing sheet.

The present inventors variously changed various kinds of thermal conductive filler (ferrite, aluminum hydroxide, and magnesium hydroxide) to be mixed, the particle diameter, and whether to perform the surface treatment according to Table 1. The present inventors have examined the characteristics of the obtained thermal electromagnetic wave absorbing sheets. In Table 1, magnesium hydroxide is described as "Mg hydroxide" and aluminum hydroxide is described as "Al hydroxide". Note that, when each of the Mg hydroxide and the Al hydroxide is heated, the water of crystallization is removed therefrom. This causes the flame retardant property of the thermal conductive electromagnetic wave absorbing sheet containing such fillers to be improved. Thus, the fillers are used as flame retardant filler.

In the examples and comparative examples, aluminum hydroxide subjected to the titanating process and having an average particle diameter of 7 µm (described as "particle diameter" simply in Table 1, and this similarly applies to the description below) and a specific gravity of 2.42 was used. In addition, magnesium hydroxide subjected to the higher fatty acid process and having an average particle diameter of 1.1 µm and a specific gravity of 2.38 or not subjected to the higher fatty acid process (unprocessed) and having an average particle diameter of 3.5 µm and a specific gravity of 2.38 was used. The ferrite used here is Ni—Zn soft ferrite. The average particle diameter can be measured by a laser diffraction method, a centrifugation method, an image analysis, or the like. In this embodiment, the indication of a commercial product was employed. According to the indication, the average particle diameter of magnesium hydroxide, aluminum hydroxide, and small-diameter ferrite was the particle diameter measured by the laser diffraction method. The average particle diameter of the large-diameter ferrite was the particle diameter measured using the test sieve (JIS Z 8801-1-2000).

TABLE 1

| Material | | Acrylic gel | Multi-functional monomer | Cross-linking agent | Phenolic anti-oxidant | Mg hydroxide subjected to higher fatty acid process | unprocessed Mg hydroxide | Al hydroxide subjected to titanating process | Ni-Zn soft ferrite | Ni-Zn soft ferrite |
|---|---|---|---|---|---|---|---|---|---|---|
| Particle diameter (µm) | | — | — | — | — | 1.1 | 3.5 | 7 | 8 | 80 |
| Specific gravity | | 0.94 | 0.9 | 0.46 | 1.15 | 2.38 | 2.38 | 2.42 | 5.1 | 5.1 |
| Example 1 | Measurement value (g) | 20.980 | 0.021 | 0.420 | 0.035 | 6.000 | | 10.000 | 110.000 | 110.000 |
| | Volume (cm3) | 22.32 | 0.02 | 0.91 | 0.03 | 2.52 | | 4.13 | 21.57 | 21.57 |
| | vol % | 30.54 | 0.03 | 1.25 | 0.04 | 3.45 | | 5.65 | 29.52 | 29.52 |

TABLE 1-continued

| Material | | Acrylic gel | Multi-functional monomer | Cross-linking agent | Phenolic anti-oxidant | Mg hydroxide subjected to higher fatty acid process | unprocessed Mg hydroxide | Al hydroxide subjected to titanating process | Ni-Zn soft ferrite | Ni-Zn soft ferrite |
|---|---|---|---|---|---|---|---|---|---|---|
| Example 2 | Measurement value(g) | 20.980 | 0.021 | 0.420 | 0.035 | 6.000 | | 10.000 | 130.000 | 90.000 |
| | Volume(cm3) | 22.32 | 0.02 | 0.91 | 0.03 | 2.52 | | 4.13 | 25.49 | 17.65 |
| | vol % | 30.54 | 0.03 | 1.25 | 0.04 | 3.45 | | 5.65 | 34.88 | 24.15 |
| Example 3 | Measurement value(g) | 20.980 | 0.021 | 0.420 | 0.035 | 6.000 | | 10.000 | 90.000 | 130.000 |
| | Volume(cm3) | 22.32 | 0.02 | 0.91 | 0.03 | 2.52 | | 4.13 | 17.65 | 25.49 |
| | vol % | 30.54 | 0.03 | 1.25 | 0.04 | 3.45 | | 5.65 | 24.15 | 34.88 |
| Example 4 | Measurement value(g) | 20.980 | 0.021 | 0.420 | 0.035 | 6.000 | | 10.000 | 150.000 | 70.000 |
| | Volume(cm3) | 22.32 | 0.02 | 0.91 | 0.03 | 2.52 | | 4.13 | 29.41 | 13.73 |
| | vol % | 30.54 | 0.03 | 1.25 | 0.04 | 3.45 | | 5.65 | 40.25 | 18.78 |
| Comparative Example 1 | Measurement value(g) | 20.980 | 0.021 | 0.420 | 0.035 | 0.000 | | 0.000 | 220.000 | 0.000 |
| | Volume(cm3) | 22.32 | 0.02 | 0.91 | 0.03 | 0.00 | | 0.00 | 43.14 | 0.00 |
| | vol % | 33.60 | 0.04 | 1.37 | 0.05 | 0.00 | | 0.00 | 64.94 | 0.00 |
| Comparative Example 2 | Measurement value(g) | 20.980 | 0.021 | 0.420 | 0.035 | | 6.000 | 10.000 | 110.000 | 110.000 |
| | Volume(cm3) | 22.32 | 0.02 | 0.91 | 0.03 | | 2.52 | 4.13 | 21.57 | 21.57 |
| | vol % | 30.54 | 0.03 | 1.25 | 0.04 | | 3.45 | 5.65 | 29.52 | 29.52 |
| Comparative Example 3 | Measurement value(g) | 20.980 | 0.021 | 0.420 | 0.035 | 6.000 | | 10.000 | 200.000 | 0.000 |
| | Volume(cm3) | 22.32 | 0.02 | 0.91 | 0.03 | 2.52 | | 4.13 | 39.22 | 0.00 |
| | vol % | 32.27 | 0.03 | 1.32 | 0.04 | 3.65 | | 5.98 | 56.71 | 0.00 |
| Comparative Example 4 | Measurement value(g) | 20.980 | 0.021 | 0.420 | 0.035 | 6.000 | | 20.00 | 180.000 | 0.000 |
| | Volume(cm3) | 22.32 | 0.02 | 0.91 | 0.03 | 2.52 | | 8.26 | 35.29 | 0.00 |
| | vol % | 32.18 | 0.03 | 1.32 | 0.04 | 3.63 | | 11.91 | 50.88 | 0.00 |
| Comparative Example 5 | Measurement value(g) | 20.98 | 0.021 | 0.420 | 0.035 | 0.000 | | 0.000 | 0.000 | 220.000 |
| | Volume(cm3) | 22.32 | 0.02 | 0.91 | 0.03 | 0.00 | | 0.00 | 0.00 | 43.14 |
| | vol % | 33.60 | 0.04 | 1.37 | 0.05 | 0.00 | | 0.00 | 0.00 | 64.94 |
| Comparative Example 6 | Measurement value(g) | 20.980 | 0.021 | 0.420 | 0.035 | 6.000 | | 1.000 | 0.000 | 150.000 |
| | Volume(cm3) | 22.32 | 0.02 | 0.91 | 0.03 | 2.52 | | 4.13 | 0.00 | 29.41 |
| | vol % | 37.61 | 0.04 | 1.54 | 0.05 | 4.25 | | 6.96 | 0.00 | 49.56 |
| Comparative Example 7 | Measurement value(g) | 20.980 | 0.021 | 0.420 | 0.035 | 6.000 | | 10.000 | 70.000 | 150.000 |
| | Volume(cm3) | 22.32 | 0.02 | 0.91 | 0.03 | 2.52 | | 4.13 | 13.73 | 29.41 |
| | vol % | 30.54 | 0.03 | 1.25 | 0.04 | 3.45 | | 5.65 | 18.78 | 40.52 |
| Comparative Example 8 | Measurement value(g) | 20.980 | 0.021 | 0.420 | 0.035 | 3.000 | | 9.500 | 110.000 | 110.000 |
| | Volume(cm3) | 22.32 | 0.02 | 0.91 | 0.03 | 1.26 | | 3.93 | 21.57 | 21.57 |
| | vol % | 31.17 | 0.03 | 1.28 | 0.04 | 1.76 | | 5.48 | 30.12 | 30.12 |
| Comparative Example 9 | Measurement value(g) | 20.980 | 0.021 | 0.420 | 0.035 | 10.000 | | 10.000 | 130.000 | 90.000 |
| | Volume(cm3) | 22.32 | 0.02 | 0.91 | 0.03 | 4.20 | | 4.13 | 25.49 | 17.65 |
| | vol % | 29.86 | 0.03 | 1.22 | 0.04 | 5.62 | | 5.53 | 34.10 | 23.61 |

Table 2 shows the characteristics of the thermal conductive electromagnetic wave absorbing sheets each having the compositions according to any of Examples 1 to 4 and Comparative Examples 1 to 9 shown in Table 1. The productivity shown in Table 2 is evaluated based on the following criteria. The productivity of the sheet that is easily formed by kneading the filler in the base material is given a circular mark ○. The productivity of the sheet that is less easily formed is given a triangular mark Δ.

TABLE 2

| Materials | | Magnetic permeability (at 10 MHz) | Thermal conductivity (W/m · K) | Hardness (ASKERC) | Flame retardant property | Productivity | Total |
|---|---|---|---|---|---|---|---|
| Example 1 | Small ferrite:large ferrite = 1:1 Flame retardant 9 vol % (surface treated Al hydroxide + surface treated Mg hydroxide) | 15.0 | 1.6 | 30 | V-2 | ○ | ○ |

TABLE 2-continued

| Materials | | Magnetic permeability (at 10 MHz) | Thermal conductivity (W/m · K) | Hardness (ASKERC) | Flame retardant property | Productivity | Total |
|---|---|---|---|---|---|---|---|
| Example 2 | Small ferrite:large ferrite = 13:9 Flame retardant 9 vol % (same as Example 1) | 14.0 | 1.4 | 40 | V-2 | ○ | ○ |
| Example 3 | Small ferrite:large ferrite = 9:13 Flame retardant 9 vol % (same as Example 1) | 15.0 | 1.5 | 40 | V-2 | ○ | ○ |
| Example 4 | Small ferrite:large ferrite = 15:7 Flame retardant 9 vol % (same as Example 1) | 11 | 1.3 | 40 | V-2 | ○ | Δ |
| Comparative Example 1 | Small ferrite only No flame retardant | 13.0 | 1.3 | 50 | None | Δ (Kneading is difficult) | × |
| Comparative Example 2 | Small ferrite:large ferrite = 1:1 Flame retardant 9 vol % (surface treated Al hydroxide + unprocessed Mg hydroxide) | 15.0 | 1.6 | 60 | V-2 | Δ (Kneading is difficult) | × |
| Comparative Example 3 | Small ferrite only Flame retardant 10 vol % | 8.0 | 1.5 | 50 | None | Δ (Kneading is difficult) | × |
| Comparative Example 4 | Small ferrite only Flame retardant 16 vol % (same as Example 1) | 6.5 | 1.5 | 45 | V-2 | Δ (Kneading is difficult) | × |
| Comparative Example 5 | Large ferrite only No flame retardant | Filling is impossible | | | | | × |
| Comparative Example 6 | Large ferrite only Flame retardant 11 vol % (same as Example 1) | 9.0 | 1.0 | 50 | V-2 | Δ (Kneading is difficult) | × |
| Comparative Example 7 | Small ferrite:large ferrite = 7:15 Flame retardant 9 vol % (same as Example 1) | Filling is impossible | | | | | × |
| Comparative Example 8 | Small ferrite:large ferrite = 1:1 Flame retardant 7 vol % (same as Example 1) | 15.0 | 1.6 | 40 | × | ○ | × |
| Comparative Example 9 | Small ferrite:large ferrite = 13:9 Flame retardant 11 vol % (same as Example 1) | 13.0 | 1.6 | 50 | V-2 | Δ (Kneading is difficult) | × |

Examinations

In Examples 1 to 4, the mixing ratio between the ferrite with small diameter (average particle diameter of 8 μm) and the ferrite with large diameter (average particle diameter of 80 μm) is in the range of 9:13 to 15:7 in volume ratio. Both kinds of ferrite are contained by 59 vol % in total in the thermal conductive electromagnetic wave absorbing sheet. In Examples 1 to 4, magnesium hydroxide subjected to the higher fatty acid process is contained by 3.45 vol % in the thermal conductive electromagnetic wave absorbing sheet. In addition, aluminum hydroxide subjected to the titanating process is contained by 5.65 vol % in the thermal conductive electromagnetic wave absorbing sheet. In other words, the flame retardant filler (flame retardant) is contained by approximately 9 vol % in the thermal conductive electromagnetic wave absorbing sheet. As shown in Table 2, in these examples, the excellent magnetic permeability as high as 10 or more at 10 MHz is obtained. In addition, the excellent thermal conductivity of 1.3 W/m·K or more was obtained. The thermal conductive electromagnetic wave absorbing sheet according to any of these examples had flexibility and had an Asker-C (ASKERC) hardness of 40 or less. Further, the productivity of these thermal conductive electromagnetic wave absorbing sheets is also excellent (○). The flame retardant property of these thermal conductive electromagnetic wave absorbing sheets corresponds to V-2.

In contrast to this, if just the ferrite with the small particle diameter is contained as the metal magnetic oxide, neither the sheet without the flame retardant in Comparative Example 1 nor the sheet containing a somewhat large amount (approximately 10 vol %) of flame retardant in Comparative Example 3 had the flame retardant property corresponding to V-2. The sheet in Comparative Example 4 containing the flame retardant 1.5 times as much as that of Examples 1 to 4 did have the flame retardant property corresponding to V-2 but the magnetic permeability of the sheet in Comparative Example 4 was drastically lower.

These experiment results indicate that the aggregation of the ferrite with the large diameter in the burning of the sheet and the falloff of the ferrite with the polymer enable the sheet to have the flame retardant property corresponding to V-2. For improving the flame retardant property with the ferrite having the large particle diameter, it may be necessary that the strength of the thermal conductive electromagnetic wave absorbing sheet is weakened by the water of crystallization released from aluminum hydroxide and magnesium hydroxide. In the case where only the ferrite with the small diameter was contained, the kneading of the filler (ferrite and flame retardant) into the base material was difficult, in which case the excellent productivity was not obtained. As is shown by the comparison with Examples 1, 2, and 4, the ferrite with the large diameter tends to largely contribute to the higher magnetic permeability as compared to the ferrite with the small diameter.

On the other hand, if the sheet contains only the ferrite with the large diameter or contains the ferrite with the large diameter twice as much as or more than the ferrite with the small diameter, even filling the base material with the filler was not possible as shown in Comparative Examples 5 and 7. As shown in Comparative Example 6, the sheet containing only the ferrite with the large diameter as the metal magnetic oxide whose amount is relatively small, and containing a little larger amount of flame retardant (approximately 10 vol %) had the flame retardant property corresponding to V-2. In this case, however, the sheet had the low magnetic permeability and the low productivity (kneading was difficult).

Among Examples 1 to 4, the thermal conductive electromagnetic wave absorbing sheet with the mixing ratio between ferrite with the small diameter and ferrite with the large diameter being 1:1 in volume ratio according to Example 1 had the highest magnetic permeability and thermal conductivity and the low hardness. In the overall evaluation (total) in Table 2, the thermal conductive electromagnetic wave absorbing sheets according to Examples 1 to 3 having a magnetic permeability of 14.0 or more and a thermal conductivity of 1.4 W/m·K or more are given a circular mark ○. The thermal conductive electromagnetic wave absorbing sheet according to Example 4 with the inferior magnetic permeability and thermal conductivity is given a triangular mark Δ.

If the mixing ratio between the ferrite with the small diameter and the ferrite with the large diameter is 1:1 in volume ratio, which is similar to Example 1 in which the characteristic is the best, not performing the surface treatment on the magnesium hydroxide as the flame retardant like in Comparative Example 2 provided the high hardness and in this case, the kneading was difficult. Even if the mixing ratio between the ferrite with the small diameter and the ferrite with the large diameter is 1:1 in volume ratio, containing the flame retardant only by approximately 7 vol % like in Comparative Example 8 failed to provide the sheet with the flame retardant property corresponding to V-2. Even if the mixing ratio between the ferrite with the small diameter and the ferrite with the large diameter is 1:1 in volume ratio, containing the flame retardant by as much as 11 vol % like in Comparative Example 9 lowered the magnetic permeability down to 13.0. Moreover, the obtained sheet was hard with a hardness of 50 and the kneading was difficult.

Compared with Comparative Examples 1 to 9, in the thermal conductive electromagnetic wave absorbing sheet in any of Examples 1 to 4, the mixing ratio between the ferrite with the small diameter and the ferrite with the large diameter is in the range of 9:13 to 15:7 in volume ratio. Both kinds of ferrite are contained by approximately 59 vol % in total in the entire thermal conductive electromagnetic wave absorbing sheet. The flame retardant subjected to the surface treatment is contained by approximately 8 to 10 vol % in the entire sheet. Thus, in each example, the magnetic permeability is 11 or more and the thermal conductivity is 1.3 W/m·k or more. Moreover, the thermal conductive electromagnetic wave absorbing sheet has an asker-C hardness of 40 or less. Moreover, the thermal conductive electromagnetic wave absorbing sheet has the excellent productivity (kneading is easy) and the flame retardant property corresponding to V-2. Therefore, the thermal conductive electromagnetic wave absorbing sheet is soft enough to be easily placed in close contact with the electronic component or the like and has the excellent thermal conductivity. This enables the heat generated in the electronic component to be released to the heat radiator. Because of having the high magnetic permeability, the thermal conductive electromagnetic wave absorbing sheet can absorb the electromagnetic wave generated from the electronic component or the like and the electronic magnetic wave coming to the electronic component or the like from the outside. In particular, the thermal conductive electromagnetic wave absorbing sheet according to Examples 1 to 3 contain the ferrite with the large diameter by 24 vol % or more. This leads to the further higher magnetic permeability of the sheet. As a result, the thermal conductive electromagnetic wave absorbing sheet can further absorb the electromagnetic wave.

In addition, the thermal conductive electromagnetic wave absorbing sheet according to Examples 1 to 4 have the flame retardant property corresponding to V-2. This leads to the higher safety of the appliance having the electronic component. The phosphorus-based flame retardant is not necessary in the thermal conductive electromagnetic wave absorbing sheet according to Examples 1 to 4. Therefore, the thermal conductive electromagnetic wave absorbing sheet can have the sufficient resistance against humidity. The thermal conductive electromagnetic wave absorbing sheet according to Examples 1 to 4 contain magnesium hydroxide subjected to the higher fatty acid process by 3 vol % or more relative to the entire sheet. Thus, the hardness of the thermal conductive electromagnetic wave absorbing sheet can be reduced further.

The embodiment of the present disclosure is not limited to the above embodiment. Other various embodiments are possible without departing from the content of the present embodiment. For example, the same effect as that of the above embodiment can be obtained under the condition as below. The average particle diameter of the ferrite with the small diameter may be varied in the range of 1 to 10 μm. The average particle diameter of the ferrite with the large diameter may be varied in the range of 50 to 100 μm. The content of both kinds of ferrite may be changed in the range of 55 to 60 vol % relative to the entire thermal conductive electromagnetic wave absorbing sheet. Other metal magnetic oxides than ferrite may be used.

The average particle diameter of magnesium hydroxide subjected to the higher fatty acid process may be changed in the range of 0.5 to 2 μm. The average particle diameter of aluminum hydroxide subjected to the titanating process may be changed in the range of 1 to 10 μm. The flame retardant filler used in the thermal conductive electromagnetic wave absorbing sheet according to the present disclosure may be other retardant filler (desirably, the flame retardant filler that discharges moisture). The amount of each kind of thermal conductive filler may be changed in the range of ±10%.

The polymer may be any polymer containing acrylate ester as a monomer. Examples of such a polymer include a polymer obtained by polymerizing or co-polymerizing an acrylic monomer such as ethyl(meth)acrylate, n-propyl (meth)acrylate, i-propyl(meth)acrylate, n-butyl(meth)acrylate, i-butyl(meth)acrylate, 2-ethylhexyl(meth)acrylate, n-hexyl(meth)acrylate, n-amyl(meth)acrylate, i-amyl(meth) acrylate, octyl(meth)acrylate, i-octyl(meth)acrylate, i-myristyl(meth)acrylate, lauryl(meth)acrylate, nonyl(meth)acrylate, i-nonyl(meth)acrylate, i-decyl(meth)acrylate, tridecyl (meth)acrylate, stearyl(meth)acrylate, or i-stearyl(meth) acrylate. Any monomer of the acrylate ester used in the (co)polymerization may be used alone or two or more of the monomers may be used in combination.

Examples of the multifunctional monomer of the difunctional acrylate include 1,6-hexanedioldiacrylate and ethylene glycol diacrylate. Examples of the applicable multifunctional monomer of the acrylate with three or more functional groups include trimethylolpropane triacrylate, pentaerythritol hexaacrylate, and dipentaerythritol hexaacrylate.

The thermal conductive electromagnetic wave absorbing sheet according to the present disclosure may be any of the following first to fourth thermal conductive electromagnetic wave absorbing sheets.

The first thermal conductive electromagnetic wave absorbing sheet is a thermal conductive electromagnetic wave absorbing sheet formed by molding a polymer, which is formed by polymerizing a monomer including acrylate ester and contains a metal magnetic oxide, into a sheet. The metal magnetic oxide includes a metal magnetic oxide with an average particle diameter of 1 to 10 μm and a metal magnetic oxide with an average particle diameter of 50 to 100 μm at a volume ratio of 9:13 to 15:7 and both kinds of metal magnetic oxides are contained by 55 to 60 vol % in the entire thermal conductive electromagnetic wave absorbing sheet and flame retardant filler subjected to surface treatment is contained by 8 to 10 vol % in the entire thermal conductive electromagnetic wave absorbing sheet.

In the second thermal conductive electromagnetic wave absorbing sheet according to the first thermal conductive electromagnetic wave absorbing sheet, the metal magnetic oxide with an average particle diameter of 50 to 100 μm is contained by 24 vol % or more in the entire thermal conductive electromagnetic wave absorbing sheet.

In the third thermal conductive electromagnetic wave absorbing sheet according to the first or second thermal conductive electromagnetic wave absorbing sheet, ferrite is contained as the metal magnetic oxide.

In the fourth thermal conductive electromagnetic wave absorbing sheet according to any of the first to third thermal conductive electromagnetic wave absorbing sheets, the flame retardant filler includes magnesium hydroxide having an average particle diameter of 0.5 to 2 μm and subjected to a higher fatty acid process and aluminum hydroxide having an average particle diameter of 1 to 10 μm and subjected to a titanating process.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

The invention claimed is:

1. A thermal conductive electromagnetic wave absorbing sheet comprising:
    a polymer including acrylate ester as a monomer;
    a metal magnetic oxide; and
    a flame retardant filler subjected to a surface treatment, wherein
    the metal magnetic oxide includes a small-diameter metal magnetic oxide with an average particle diameter of 1 to 10 μm and a large-diameter metal magnetic oxide with an average particle diameter of 50 to 100 μm,
    a mixing ratio between the small-diameter metal magnetic oxide and the large-diameter metal magnetic oxide is in a range of 9:13 to 15:7 in volume ratio,
    the small-diameter metal magnetic oxide and the large-diameter metal magnetic oxide are contained by 55 to 60 vol % in total in the entire thermal conductive electromagnetic wave absorbing sheet,
    the flame retardant filler subjected to the surface treatment is contained by 8 to 10 vol % in the entire thermal conductive electromagnetic wave absorbing sheet, and
    the flame retardant filler includes magnesium hydroxide having an average particle diameter of 0.5 to 2 μm and subjected to a higher fatty acid process and aluminum hydroxide having an average particle diameter of 1 to 10 μm and subjected to a titanating process.

2. The thermal conductive electromagnetic wave absorbing sheet according to claim 1,
    wherein the large-diameter metal magnetic oxide is contained by 24 vol % or more in the entire thermal conductive electromagnetic wave absorbing sheet.

3. The thermal conductive electromagnetic wave absorbing sheet according to claim 1,
    wherein ferrite is contained as the metal magnetic oxide.

4. The thermal conductive electromagnetic wave absorbing sheet according to claim 2,
    wherein ferrite is contained as the metal magnetic oxide.

* * * * *